(12) United States Patent
Krishna et al.

(10) Patent No.: US 8,487,683 B1
(45) Date of Patent: Jul. 16, 2013

(54) CIRCUIT FOR GENERATING MULTI-PHASE NON-OVERLAPPING CLOCK SIGNALS

(75) Inventors: Siddhartha Gopal Krishna, New Delhi (IN); Senthil Velan K, Chennai (IN)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 13/356,610

(22) Filed: Jan. 23, 2012

(51) Int. Cl.
*H03K 5/13* (2006.01)

(52) U.S. Cl.
USPC .......................... 327/239; 327/291; 327/259

(58) Field of Classification Search
USPC ............... 327/291, 239, 259, 231–233, 237, 327/241–245, 258, 250–251
See application file for complete search history.

(56) References Cited

U.S. PATENT DOCUMENTS

| | | |
|---|---|---|
| 5,532,633 A | 7/1996 | Kawai |
| 5,692,164 A | 11/1997 | Pantelakis |
| 7,649,957 B2 | 1/2010 | Garrity |
| 8,141,024 B2 * | 3/2012 | Markov et al. ............ 716/132 |
| 2006/0038596 A1 * | 2/2006 | Wang ............................ 327/158 |

* cited by examiner

*Primary Examiner* — Long Nguyen
*Assistant Examiner* — Thomas Skibinski
(74) *Attorney, Agent, or Firm* — Charles Bergere (57) ABSTRACT

A circuit for generating multi-phase, non-overlapping clock signals includes a shift register that generates first and second clock signals from an input clock signal. First and second circuit modules generate corresponding first and second interim signals using the first and second clock signals and first and second feedback signals, respectively. The first and second interim signals are non-overlapping by at least a predetermined minimum time difference. The first and second interim signals are multiplexed to generate an output signal. The output signal is delayed by a first predetermined time to generate a first delay signal. The first delay signal is delayed by a second predetermined time to generate a second delay signal. The second delay signal is de-multiplexed to generate the first and the second feedback signals, and the first delay signal is de-multiplexed to generate the set of multi-phase, non-overlapping clock signals.

16 Claims, 6 Drawing Sheets

CIRCUIT FOR GENERATING MULTI-PHASE NON-OVERLAPPING CLOCK SIGNALS

BACKGROUND OF THE INVENTION

The present invention relates generally to integrated circuits and, more particularly, to generating multi-phase, non-overlapping clock signals used in integrated circuits.

Figure 1:
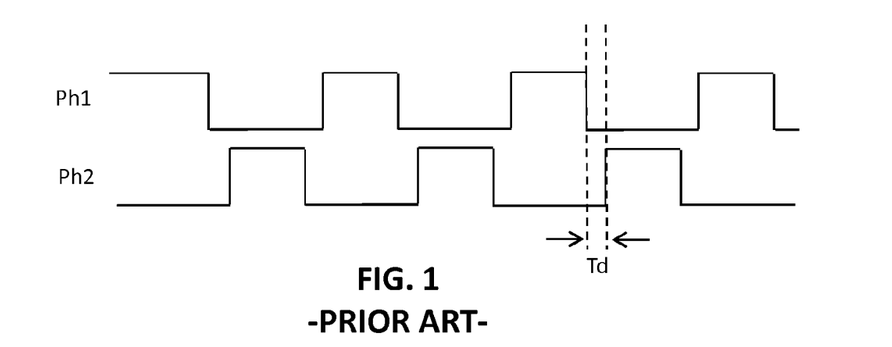
FIG. 1 is a timing diagram of two non-overlapping clock signals.

Many digital signal processing circuits require synchronized clock signals for synchronizing the operations of internal circuits. Multi-phase clock signals are generally used as synchronized clock signals in circuits including cyclic analog-to-digital converters (ADCs). Multi-phase clock signals are generated by dividing the frequency of a reference clock signal. In addition to synchronization, multi-phase clock signals must meet other specific requirements of the digital signal processing circuits. One such requirement is the generation of non-overlapping clock signals. Non-overlapping clock signals are clock signals having active periods that do not overlap. FIG. 1 shows a timing diagram of two non-overlapping clock signals, $Ph_1$ and $Ph_2$ in which the active periods $Ph_1$ and $Ph_2$ do not overlap.

Figure 2:
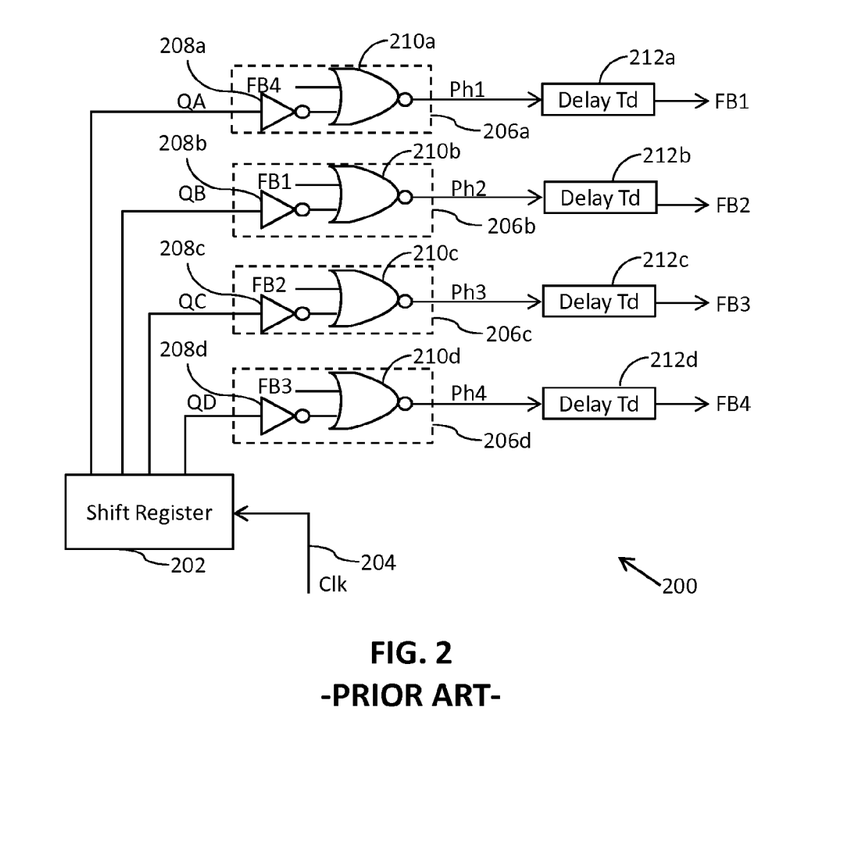
FIG. 2 is a schematic block diagram of a conventional circuit for generating multi-phase, non-overlapping clock signals.

FIG. 2 is a schematic diagram of a conventional circuit 200 for generating multi-phase, non-overlapping clock signals. The circuit 200 generates a set of four non-overlapping clock signals that are phase-shifted from each other and includes a shift register 202 that receives an input clock signal 204 and divides the frequency of the input clock signal 204 to generate four phase-shifted clock signals $Q_A$, $Q_B$, $Q_C$ and $Q_D$. The number of phase-shifted clock signals corresponds to the number of non-overlapping clock signals required to be generated by the circuit 200. The phase-shifted clock signals $Q_A$, $Q_B$, $Q_C$ and $Q_D$ are provided to corresponding circuit modules 206a, 206b, 206c and 206d (collectively referred to as circuit modules 206). Each circuit module 206 includes a NOT gate connected to a NOR gate. As shown, the circuit module 206a includes NOT gate 208a connected to NOR gate 210a. The NOT gate 208a receives the clock signal $Q_A$, inverts it, and provides the inverted clock signal to an input of the NOR gate 210a. The NOR gate 210a also receives a feedback signal $FB_4$ and generates a first clock signal $Ph_1$. Similarly, the circuit modules 206b-206d generate second, third and fourth clock signals, $Ph_2$, $Ph_3$ and $Ph_4$. The set of clock signals $Ph_1$-$Ph_4$ are delayed using corresponding delay circuits 212a-212d, which generally comprise strings of buffers. The delay circuits 212a-212d introduce a predetermined time delay $T_d$ and generate corresponding feedback signals $FB_1$, $FB_2$, $FB_3$, and $FB_4$. The feedback signals $FB_2$-$FB_4$ are provided to the circuit modules 206a-206d in a cyclic order, i.e., the feedback signal generated using one clock signal is provided to a circuit module generating the next clock signal. Thus, feedback signals $FB_1$, $FB_2$, $FB_3$ and $FB_4$ are provided to the circuit modules 206b, 206c, 206d and 206a, respectively. As mentioned earlier, the feedback signals $FB_2$-$FB_4$ are provided as inputs to the respective NOR gates 210b, 210c, 210d and 210a to ensure that the clock signals $Ph_1$-$Ph_4$ have non-overlapping active periods and adjacent clock signals (i.e., $Ph_1$ and $Ph_2$, $Ph_2$ and $Ph_3$, $Ph_3$ and $Ph_4$, and $Ph_4$ and $Ph_1$) are separated by the predetermined time $T_d$. As shown in FIG. 1, the active periods of the clock signals $Ph_1$ and $Ph_2$ are separated by the predetermined time $T_d$.

The conventional circuit 200 introduces significant area overhead when transferred to an integrated circuit because it uses a separate circuit arrangement for generating each non-overlapping clock signal. For example, the clock signal $Ph_1$ is generated using the circuit module 206a and the delay circuit 212a. The overhead increases proportionally with the number of non-overlapping clock signals generated. Also, generation of each clock signal using a separate delay circuit introduces small variations in the delay time $T_d$. These variations lead to time mismatches between the non-overlapping clock signals and lower the performance of a cyclic ADC or any other circuit that uses such clock signals.

Therefore, there is a need for a circuit that generates multi-phase, non-overlapping clock signals and does not significantly increase area overhead and that overcomes the above-mentioned limitations.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements. It is to be understood that the drawings are not to scale and have been simplified for ease of understanding the invention.

DETAILED DESCRIPTION OF THE PRESENT INVENTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a circuit for generating multi-phase, non-overlapping clock signals is provided. The circuit includes a shift register that generates first and second clock signals by dividing an input clock signal. The first and second clock signals are respectively received by first and second circuit modules that are connected to the shift register. The first circuit module receives a first feedback signal and generates a first interim signal using the first clock signal and the first feedback signal. The second circuit module receives the second feedback signal and generates a second interim signal. The first and second interim signals are non-overlapping by at least a predetermined minimum time difference. A multiplexer multiplexes the first and second interim signals to generate an output signal. A first delay circuit delays the output signal by a first predetermined time to generate a first delay signal. A second delay circuit delays the first delay signal by a second predetermined time to generate a second delay signal. A first de-multiplexer receives the second delay signal and generates the first and the second feedback signals. A second de-multiplexer receives the first delay signal and generates a set of multi-phase, non-overlapping clock signals.

In another embodiment of the present invention, a circuit for generating multi-phase, non-overlapping clock signals is provided. The circuit includes a shift register that generates a plurality of clock signals by dividing the frequency of an input clock signal. The circuit also includes a plurality of circuit modules that receive a plurality of clock signals. The circuit modules also receive a plurality of feedback signals. Each circuit module generates a clock signal of a set of multi-phase, non-overlapping clock signals using the corresponding clock signal and feedback signal. The clock signals are generated by the plurality of circuit modules such that the non-overlapping period between the clock signals is of at least a predetermined minimum time. A multiplexer multiplexes the multi-phase, non-overlapping clock signals to generate an output signal. A first delay circuit delays the output signal by a first predetermined time to generate a first delay signal. A second delay circuit delays the first delay signal by a second predetermined time to generate a second delay signal. The second delay signal is de-multiplexed by a first de-multiplexer to generate the plurality of feedback signals. The first delay signal is de-multiplexed by a second de-multiplexer to generate another set of multi-phase, non-overlapping clock signals.

In yet another embodiment of the present invention, a circuit for generating sets of multi-phase, non-overlapping clock signals is provided. The circuit includes a shift register that generates a plurality of clock signals by dividing an input clock signal. A plurality of circuit modules receive the plurality of clock signals and a plurality of feedback signals and generate a first, early set of multi-phase, non-overlapping clock signals. A plurality of first delay circuits are connected to the plurality of circuit modules and receive the first set of non-overlapping clock signals and generate a second set of multi-phase, non-overlapping clock signals that are offset from the first set of clock signals by a first predetermined time. A multiplexer is connected to the plurality of first delay circuits and multiplexes the second set of clock signals and generates an output signal. A second delay circuit generates a second delay signal by delaying the output signal by a second predetermined time. A de-multiplexer receives the second delay signal and generates the plurality of feedback signals.

Various embodiments of the present invention provide a system and method for generating multi-phase, non-overlapping clock signals. The system of the present invention uses a single delay circuit to generate multiple non-overlapping clock signals as compared to multiple delay circuits required in prior-art systems. The use of a single delay circuit reduces area overhead and eliminates variations in the delay time that are otherwise introduced by conventional systems. Therefore, the multi-phase, non-overlapping clock signals generated by the present invention are reliable as compared to those generated by conventional systems and in turn, increase the reliability of circuits that use these signals. The circuit of the present invention is flexible and can be re-configured to generate multiple non-overlapping clock signals with different phases.

Figure 3:
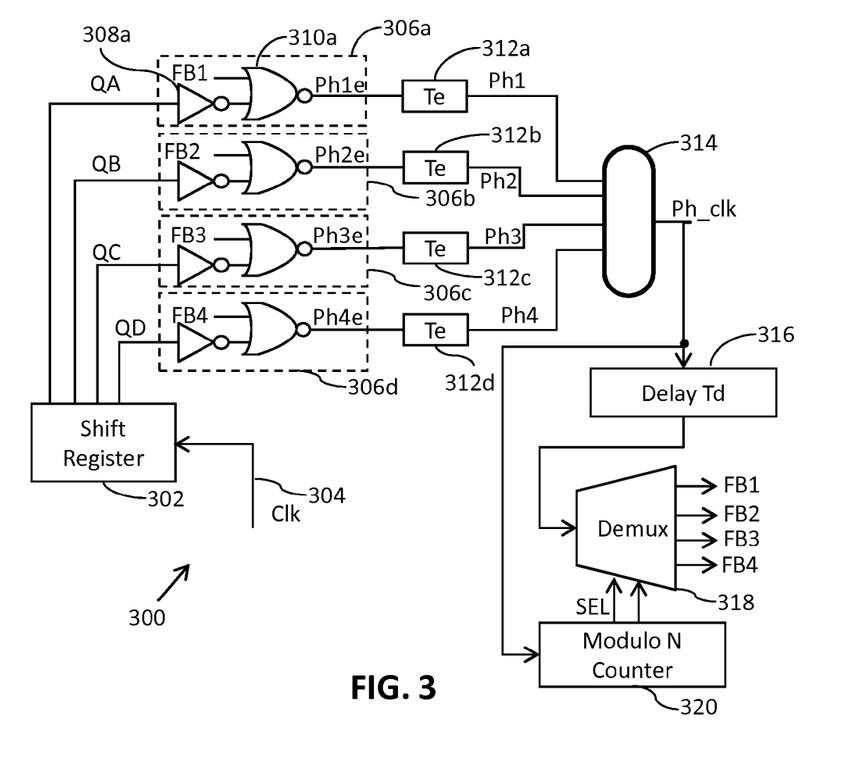
FIG. 3 is a schematic block diagram of a circuit for generating multi-phase, non-overlapping clock signals in accordance with an embodiment of the present invention.

Referring now to FIG. 3, a schematic block diagram of a circuit 300 for generating multi-phase, non-overlapping clock signals in accordance with an embodiment of the present invention is shown. The circuit 300 generates two sets of four non-overlapping clock signals that are phase shifted from each other. The circuit 300 includes a shift register 302 that receives an input clock signal 304 and divides the frequency of the input clock signal 304 to generate four phase-shifted clock signals $Q_A$, $Q_B$, $Q_C$ and $Q_D$. The number of phase-shifted clock signals corresponds to the number of non-overlapping clock signals that are required to be generated by the circuit 300. Clock signals $Q_A$, $Q_B$, $Q_C$ and $Q_D$ are provided to corresponding circuit modules 306a, 306b, 306c and 306d (collectively referred to as circuit modules 306). Each circuit module 306 includes a NOT gate connected to a NOR gate. For example, the circuit module 306a includes NOT gate 308a connected to NOR gate 310a. The NOT gate 308a receives the clock signal $Q_A$, inverts it, and provides the inverted clock signal /$Q_A$ to an input of the NOR gate 310a. The NOR gate 310a also receives a feedback signal $FB_1$ and generates an early signal $Ph_{1e}$ corresponding to a first non-overlapping clock signal $Ph_1$. Similarly, the circuit modules 306b-306d generate early signals $Ph_{2e}$, $Ph_{3e}$ and $Ph_{4e}$ corresponding to the remaining non-overlapping clock signals $Ph_2$, $Ph_3$ and $Ph_4$. The early signals $Ph_{1e}$-$Ph_{4e}$ represent the first set of non-overlapping clock signals. The early signals $Ph_{1e}$-$Ph_{4e}$ and input to respective delay circuits 312a-312d to generate four non-overlapping clock signals $Ph_1$-$Ph_4$. The clock signals $Ph_1$-$Ph_4$ represent the second set of non-overlapping clock signals. The delay circuits 312a-312d delay the corresponding early signals $Ph_{1e}$-$Ph_{4e}$ by a predetermined time $T_e$. As a result, the first set ($Ph_{1e}$-$Ph_{4e}$) and the second set ($Ph_1$-$Ph_4$) of non-overlapping clock signals have a time difference of $T_e$. The delay circuits 312a-312d can be implemented as a string of buffers, as is known in the art. The delay circuits 312a-312d also may include, for example, capacitors at intermediate stage outputs to increase delay and/or the buffers themselves may be weak (small W/L device ratios), also as is known in the art. It is preferred that each of the delay circuits has the same circuit structure so that they generate equivalent delays.

Figure 4:
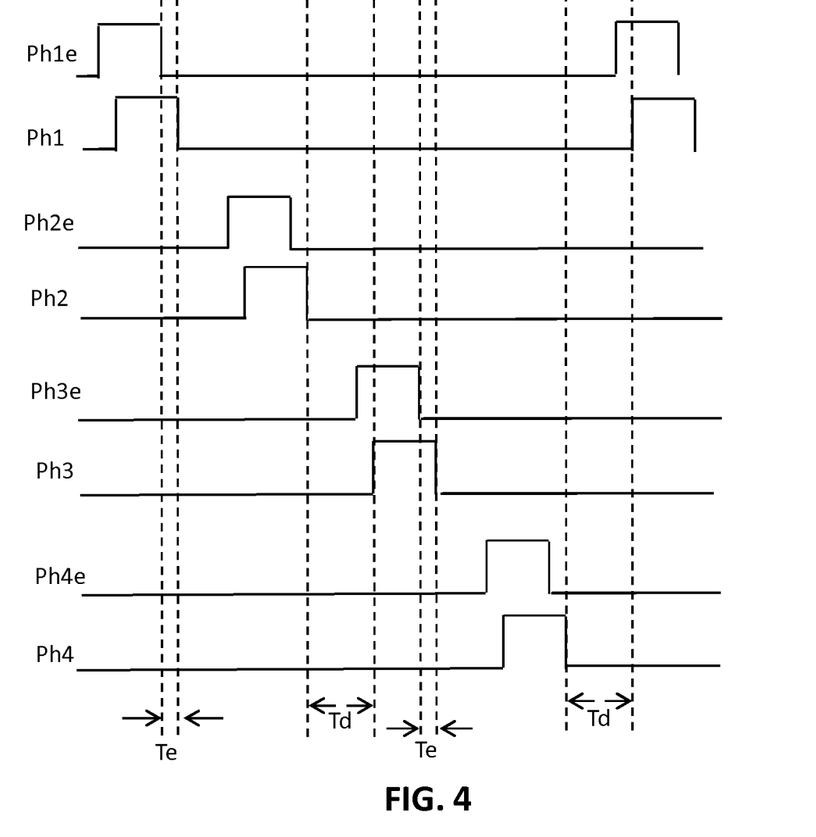
FIG. 4 is a timing diagram of four exemplary non-overlapping clock signals generated by the circuit of FIG. 3.

FIG. 4 is a timing diagram showing four exemplary non-overlapping clock signals generated by the circuit 300. The delay $T_e$ corresponds to the delay between the early signals $Ph_{1e}$-$Ph_{4e}$ and the corresponding non-overlapping clock signals $Ph_1$-$Ph_4$. The delay $T_e$ is shown between early signals $Ph_{1e}$ and $Ph_{3e}$ and respective clock signals $Ph_1$ and $Ph_3$. The non-overlapping clock signals $Ph_1$-$Ph_4$ are multiplexed using a multiplexer 314 to generate an output signal PH_CLK. In one embodiment, an OR gate is used to multiplex the non-overlapping clock signals $Ph_1$-$Ph_4$. The output signal PH_CLK is input to a delay circuit 316 that introduces a predetermined time delay $T_d$ in the output signal PH_CLK. The predetermined delay $T_d$ corresponds to the non-overlapping time between the clock signals $Ph_1$, $Ph_2$, $Ph_3$ and $Ph_4$, as shown in FIG. 4. The delay circuit 316 is similar to the delay circuits 312 in that it comprises a string of buffers and may or may not be modified as described above.

The output of the delay circuit 316 is de-multiplexed using a de-multiplexer 318. The de-multiplexer receives a select signal SEL from a counter 320, which in a preferred embodiment is a modulo-N counter. The binary counter 320 receives the output signal PH_CLK as a clock signal and generates the select signal SEL. The de-multiplexer 318 generates four feedback signals $FB_1$, $FB_2$, $FB_3$, and $FB_4$. The feedback signals $FB_1$-$FB_4$ are provided to corresponding ones of the circuit modules 306a-306d. Although the circuit 300 is shown to generate two sets of four non-overlapping clock signals, the invention should not be considered limited to generating four non-overlapping clock signals only, as it should be understood by those of skill in the art that the circuit can be extended to generate any number of non-overlapping clock signals (see, for example, FIG. 5, discussed below).

The circuit 300 differs from the conventional circuit 200 in that the second set of clock signals $Ph_1$-$Ph_4$ are input to the mux 314 and then a single delay circuit 316 is used to generate the delayed clock signals that are used to generate the feedback signals $FB_1$-$FB_4$. Using the single delay circuit 316 saves the area used by the four delay circuits 212a-212d of the conventional circuit 200 (less the area of the mux 314, demux 318, and modulo-N counter 320), and since each feedback signal is generated by the same circuitry, the delay values therebetween are not skewed.

Figure 5:
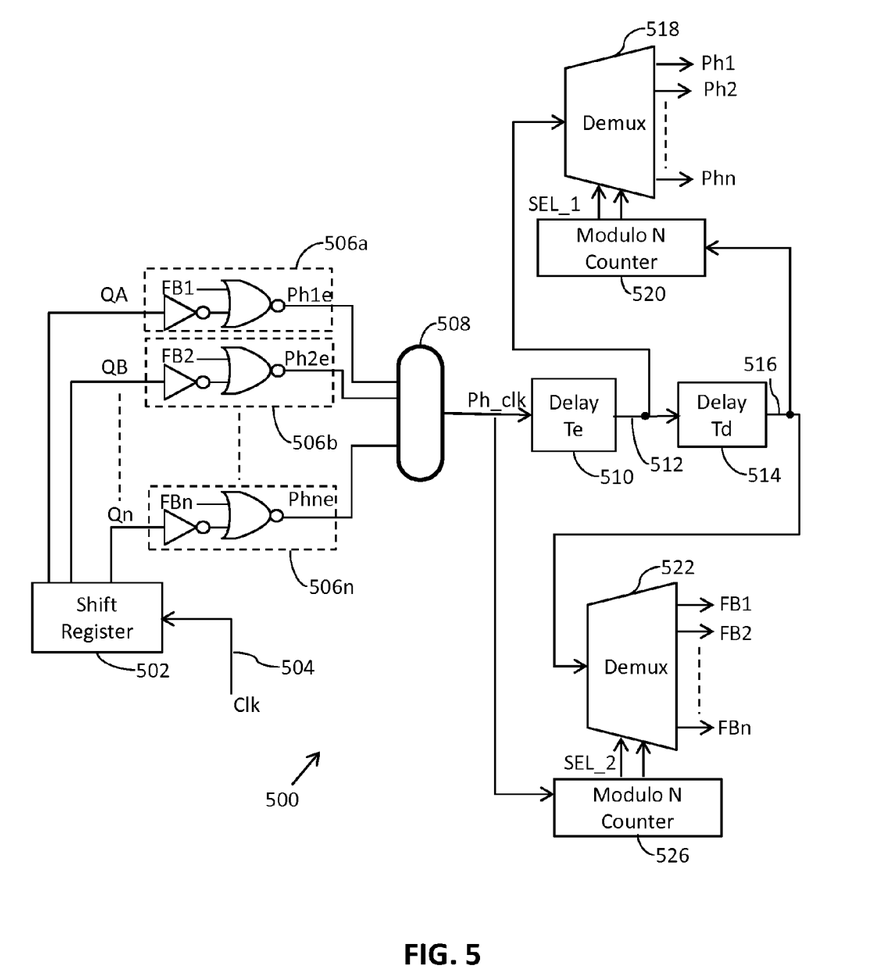
FIG. 5 is a schematic block diagram of a circuit for generating multi-phase, non-overlapping clock signals in accordance with another embodiment of the present invention.

Referring now to FIG. 5, a schematic block diagram of a circuit 500 for generating multi-phase, non-overlapping clock signals in accordance with another embodiment of the present invention is shown. The circuit 500 generates two sets of non-overlapping clock signals, each set including 'n' clock signals that are phase shifted from each other. The circuit 500 includes a shift register 502 that divides the frequency of an input clock signal 504 to generate n phase-shifted clock signals $Q_A$, $Q_B$ to $Q_n$. Circuit modules 506a, 506b to 506n generate early signals $Ph_{1e}$, $Ph_{2e}$ to $Ph_{ne}$ using corresponding clock signals $Q_A$-$Q_n$ and corresponding feedback signals $FB_1$, $FB_2$ to $FB_n$. The early signals $Ph_{1e}$-$Ph_{ne}$ represent the first set of non-overlapping clock signals and provided to a multiplexer 508, which in the embodiment shown is an OR gate, to generate an output signal PH_CLK. The output signal PH_CLK is delayed by a predetermined time $T_e$ with a first delay circuit 510 to generate a first delay signal 512. The first delay signal 512 is delayed by a predetermined time $T_d$ with a second delay circuit 514 to generate a second delay signal 516. The first delay signal 512 is de-multiplexed by a first de-multiplexer 518 to generate non-overlapping clock signals $Ph_1$, $Ph_2$ to $Ph_n$. The clock signals $Ph_1$-$Ph_n$ represent the second set of non-overlapping clock signals. A first counter 520 receives the second delay signal 516 as a clock signal and generates a select signal SEL_1 for the first de-multiplexer 518. A second de-multiplexer 522 receives the second delay signal 516 and generates the feedback signals $FB_1$-$FB_n$. A select signal SEL_2 for the second de-multiplexer 522 is generated by a second counter 526. The second counter 526 receives the output signal PH_CLK as a clock signal. In this embodiment, both the first and second delay circuits 510 and 514 are provided on the output side of the multiplexer 508 so all of the clock signals of the first set $Ph_{1e}$-$Ph_{ne}$ will travel essentially the same delay path. Also, in a preferred embodiment, the first and second counters 520 and 526 comprise modulo-N counters.

Figure 6:
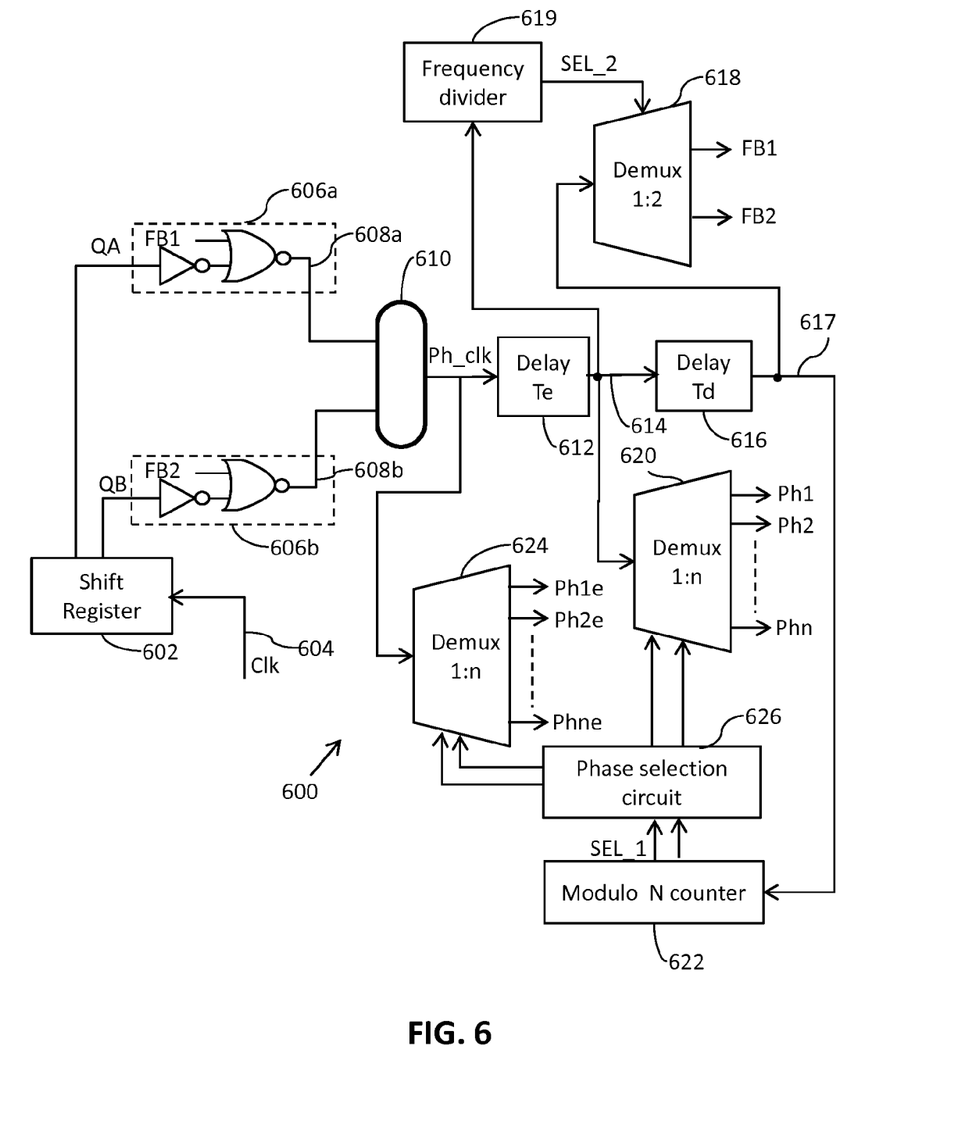
FIG. 6 is a schematic block diagram of a circuit for generating multi-phase, non-overlapping clock signals in accordance with yet another embodiment of the present invention.

Referring now to FIG. 6, a schematic block diagram of a circuit 600 for generating multi-phase, non-overlapping clock signals in accordance with yet another embodiment of the present invention is shown. The circuit 600 generates two sets of 'n' non-overlapping clock signals that are phase shifted from each other. The circuit 600 includes a shift register 602 that divides the frequency of an input clock signal 604 to generate two phase-shifted clock signals $Q_A$ and $Q_B$. Circuit modules 606a and 606b receive the clock signals $Q_A$ and $Q_B$, and feedback signals $FB_1$ and $FB_2$, respectively, and generate corresponding interim signals 608a and 608b. The interim signals 608a and 608b are multiplexed, in the embodiment shown with OR gate 610, to generate an output signal PH_CLK. The output signal PH_CLK is delayed with a first delay circuit 612 to generate a first delay signal 614. The first delay circuit 612 introduces a delay of a predetermined time $T_e$. The first delay signal 614 is provided to a second delay circuit 616 and delayed by a second predetermined time $T_d$ to generate a second delay signal 617. The second predetermined time $T_d$ determines the non-overlapping time between the non-overlapping clock signals of each set.

The second delay signal 617 is provided to a first de-multiplexer 618 to generate the feedback signals $FB_1$ and $FB_2$. A frequency divider 619 generates and provides a select signal SEL_2 to the first de-multiplexer 618. The frequency divider 619 divides the frequency of the first delay signal 614 (in one embodiment by half) to generate the select signal SEL_2. The feedback signals $FB_1$ and $FB_2$ are supplied to the corresponding circuit modules 606a and 606b.

The first delay signal 614 is de-multiplexed by a second de-multiplexer 620 to generate a first set of non-overlapping clock signals $Ph_1$, $Ph_2$ to $Ph_n$. A modulo-N counter 622 is used to generate a select signal SEL_1 for the second de-multiplexer 620. The second delay signal 617 is provided as a clock signal to the modulo-N counter 622. The modulo-N counter 622 generates count values from 0 to n−1. The second de-multiplexer 620 receives the count values as SEL_1 signal and de-multiplexes the first delay signal 614 to generate the non-overlapping clock signals $Ph_1$-$Ph_n$. The modulo-N counter 622 can be set to any number N to generate the desired number of non-overlapping clock signals. For example, the modulo-N counter 622 can be set to count from 0 to 3 to generate four non-overlapping clock signals or the modulo-N counter 622 can be set to count from 0 to 7 to generate eight non-overlapping clock signals.

The circuit 600 is re-configurable and can be used to generate any number of non-overlapping clock signals. The circuit 600 also enables generation of early signals corresponding to non-overlapping clock signals $Ph_1$-$Ph_n$. A third de-multiplexer 624 de-multiplexes the output signal PH_to generate early signals $Ph_{1e}$, $Ph_{2e}$ to $Ph_{ne}$ based on the select signal SEL_1. The early signals $Ph_{1e}$-$Ph_{ne}$ represent the second set of non-overlapping clock signals.

The circuit 600 may also include a phase selection circuit 626 connected between the modulo-N counter 622 and the second and third de-multiplexers 620 and 624. The phase selection circuit 626 selects particular values of the select signal SEL_1 and controls the generation of the non-overlapping clock signals $Ph_1$-$Ph_n$ as well as early signals $Ph_{1e}$-$Ph_{ne}$. For example, if the modulo-N counter 622 is programmed to generate count values 0 to 7, the phase selection circuit 626 may select and provide count values of 0 and 2 to the second and third de-multiplexers 620 and 624. In such a case, the second de-multiplexer 620 generates two non-overlapping clock signals, i.e., $Ph_1$ and $Ph_3$, and the third de-multiplexer 624 generates two early signals, i.e., $Ph_{1e}$ and $Ph_{3e}$. The non-overlapping time between $Ph_1$ and $Ph_3$ is Td.

Figure 7:
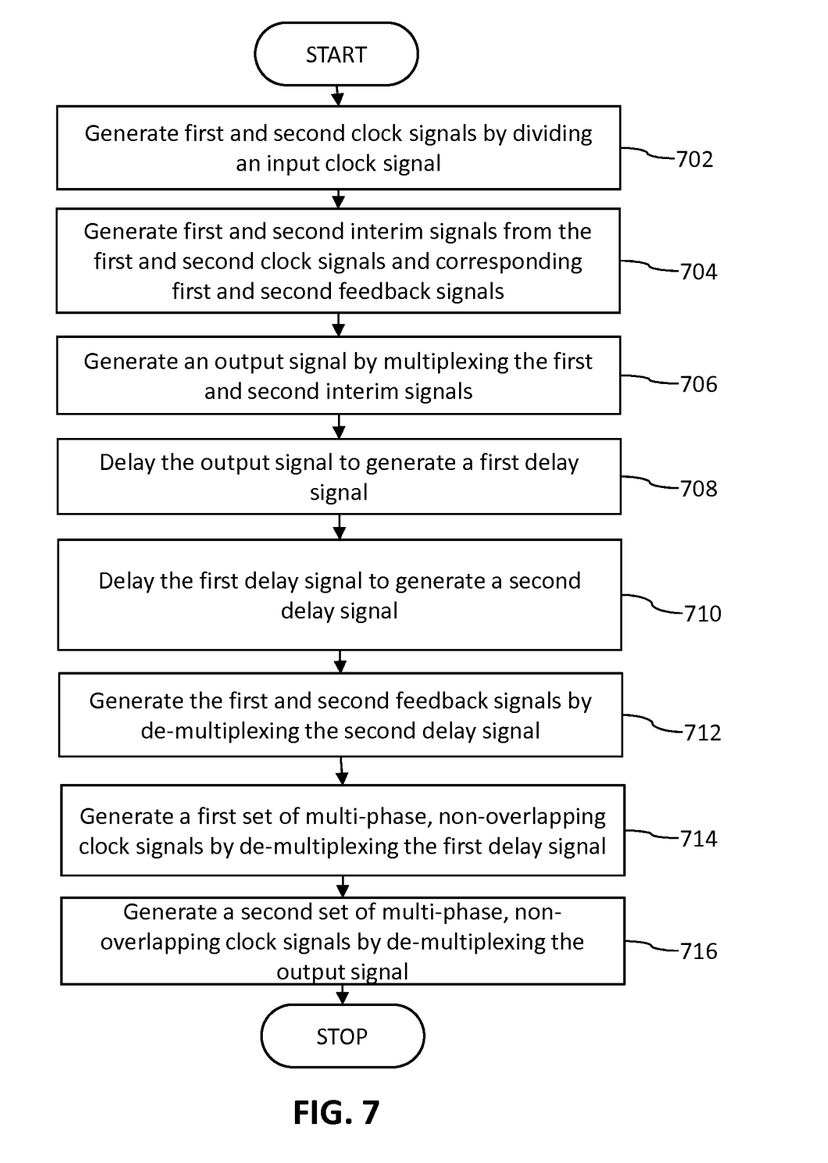
FIG. 7 is a flow chart illustrating a method for generating multi-phase, non-overlapping clock signals in accordance with an embodiment of the present invention.

Referring now to FIG. 7, a flow chart illustrating a method for generating multi-phase, non-overlapping clock signals in accordance with an embodiment of the present invention is shown. Various steps of the flow chart will be explained in conjunction with FIG. 6. At step 702, two phase-shifted clock signals, $Q_A$ and $Q_B$, are generated by the shift register 602 by dividing the frequency of the input clock signal 604. At step 704, the interim signals 608a and 608b are generated using the clock signals $Q_A$ and $Q_B$, and feedback signals $FB_1$ and $FB_2$. The interim signals 608a and 608b are non-overlapping by at least a predetermined minimum time difference. The interim signals are multiplexed by the OR gate 610 at step 706. At step 708, the output signal PH_CLK is generated and is delayed by the predetermined time, $T_e$, to generate the first delay signal 614. At step 710, the first delay signal 614 is delayed by the predetermined time, $T_d$, to generate the second delay signal 617. At step 712, the first de-multiplexer 618 de-multiplexes the second delay signal 617 to generate the feedback signals $FB_1$ and $FB_2$. The select signal SEL_2 to the first de-multiplexer 618 is generated by the frequency divider 619 by dividing the frequency of the first delay signal 614. At step 714, the first delay signal 614 is de-multiplexed by the second de-multiplexer 620 to generate 'n' non-overlapping clock signals $Ph_1$-$Ph_n$. The non-overlapping clock signals $Ph_1$-$Ph_n$ represent the first set of non-overlapping clock signals. The select signal SEL_1 to the second de-multiplexer 620 is generated by the modulo-N counter 622 using the second delay signal 617. At 716, the output signal PH_CLK is de-multiplexed by the third de-multiplexer 624 to generate early signals $Ph_{e2}$-$Ph_{en}$. The early signals $Ph_{e1}$-$Ph_{en}$ represent the second set of non-overlapping clock signals. The select signal SEL_1 is also provided to the third de-multiplexer 624.

It will be apparent to those skilled in the art that many circuits require multi-phase, non-overlapping signals and their corresponding early signals for operation. For example, switched capacitor based circuits use early signals to implement bottom plate sampling to avoid signal dependent charge injection. In other words, early signals are required for designing parasitic insensitive switched capacitor circuits. A circuit, such as the circuit 600, can also be used to generate one set of non-overlapping clock signals ($Ph_1$-$Ph_n$) without generating the early signals ($Ph_{1e}$-$Ph_{ne}$). In this case, the third de-multiplexer 624 is not required in the circuit 600.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A circuit for generating multi-phase, non-overlapping clock signals from an input clock signal, comprising:
    a shift register that receives the input clock signal and generates first and second clock signals by dividing the input clock signal;
    first and second circuit modules connected to the shift register, wherein the first circuit module receives the first clock signal and a first feedback signal, and generates a first interim signal, and the second circuit module receives the second clock signal and a second feedback signal, and generates a second interim signal, wherein the first and second interim signals are non-overlapping by at least a predetermined minimum time difference;
    a multiplexer, connected to the first and second circuit modules, for receiving the first and second interim signals and generating an output signal;
    a first delay circuit, connected to the multiplexer, for receiving the output signal and generating a first delay signal by delaying the output signal by a first predetermined time;
    a second delay circuit, connected to the first delay circuit, for receiving the first delay signal and generating a second delay signal by delaying the first delay signal by a second predetermined time;
    a first de-multiplexer, connected to the second delay circuit, for receiving the second delay signal and generating the first and the second feedback signals;
    a second de-multiplexer, connected to the first delay circuit, for receiving the first delay signal and generating a first set of multi-phase, non-overlapping clock signals; and
    a frequency divider, connected between an output terminal of the first delay circuit and a select input of the first de-multiplexer, for generating a first de-multiplexer select signal.

2. The circuit of claim 1, further comprising a third de-multiplexer, connected to the multiplexer, for receiving the output signal and generating a second set of multi-phase, non-overlapping clock signals.

3. The circuit of claim 2, wherein the first predetermined time determines a delay between the first set of multi-phase, non-overlapping clock signals and the second set of multi-phase, non-overlapping clock signals.

4. The circuit of claim 2, wherein the second predetermined time determines the non-overlapping time between the multi-phase, non-overlapping clock signals of the second set.

5. The circuit of claim 1, wherein the first circuit module comprises:
    a first NOT gate for receiving the first clock signal; and
    a first NOR gate having a first input terminal connected to an output terminal of the first NOT gate and a second input terminal for receiving the first feedback signal, wherein the first NOR gate generates the first interim signal.

6. The circuit of claim 5, wherein the second circuit module comprises:
    a second NOT gate for receiving the second clock signal; and
    a second NOR gate having a first input terminal connected to an output terminal of the second NOT gate and a second input terminal for receiving the second feedback signal, wherein the second NOR gate generates the second interim signal.

7. The circuit of claim 1, further comprising a counter, connected between an output terminal of the second delay circuit and a select input of the second de-multiplexer, for receiving the second delay signal and generating a second de-multiplexer select signal.

8. The circuit of claim 7, wherein the counter comprises a modulo-N counter.

9. The circuit of claim 7, further comprising a phase selection circuit connected between the counter and the second de-multiplexer for receiving the second de-multiplexer select signal and selecting at least one clock signal from the first set of multi-phase, non-overlapping clock signals.

10. A circuit for generating first and second sets of multi-phase, non-overlapping clock signals from an input clock signal, comprising:
    a shift register that receives the input clock signal and generates a plurality of clock signals by dividing the input clock signal;
    a plurality of circuit modules, connected to the shift register for receiving the plurality of clock signals and a plurality of feedback signals and generating the second set of multi-phase, non-overlapping clock signals, wherein the non-overlapping period between the multi-phase, non-overlapping clock signals of the second set is of at least a predetermined minimum time;
    a multiplexer, connected to the plurality of circuit modules, for multiplexing the second set of multi-phase, non-overlapping clock signals and generating an output signal;
    a first delay circuit, connected to the multiplexer, for receiving the output signal and generating a first delay signal by delaying the output signal by a first predetermined time;
    a second delay circuit, connected to the first delay circuit, for receiving the first delay signal and generating a second delay signal by delaying the first delay signal by a second predetermined time;

a first de-multiplexer, connected to the second delay circuit, for receiving the second delay signal and generating the plurality of feedback signals;

a second de-multiplexer, connected to the first delay circuit, for receiving the first delay signal and generating the first set of multi-phase, non-overlapping clock signals; and a counter, connected between an output terminal of the second delay circuit and a select input of the second de-multiplexer, for receiving the second delay signal and generating a second de-multiplexer select signal.

11. The circuit of claim 10, further comprising a first counter, connected between an output terminal of the multiplexer and a select input of the first de-multiplexer, for receiving the output signal and generating a first de-multiplexer select signal.

12. The circuit of claim 11, wherein the first counter comprises a modulo-N counter.

13. The circuit of claim 11, further comprising a second counter, connected between an output terminal of the second delay circuit and a select input of the second de-multiplexer, for receiving the second delay signal and generating a second de-multiplexer select signal.

14. The circuit of claim 13, wherein the second counter comprises a modulo-N counter.

15. The circuit of claim 10, wherein the first predetermined time determines a delay between the first set of multi-phase, non-overlapping clock signals and the second set of multi-phase, non-overlapping clock signals.

16. The circuit of claim 10, wherein the second predetermined time determines a non-overlapping time between the multi-phase, non-overlapping clock signals of the first set.

* * * * *